(12) United States Patent
Katoh

(10) Patent No.: US 7,576,405 B2
(45) Date of Patent: Aug. 18, 2009

(54) SEMICONDUCTOR INTEGRATED CIRCUIT FOR REDUCING LEAK CURRENT THROUGH MOS TRANSISTORS

(75) Inventor: Tetsuya Katoh, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 512 days.

(21) Appl. No.: 11/526,577

(22) Filed: Sep. 26, 2006

(65) Prior Publication Data

US 2007/0074134 A1  Mar. 29, 2007

(30) Foreign Application Priority Data

Sep. 27, 2005  (JP) ............................. 2005-280053

(51) Int. Cl.
*H01L 29/40* (2006.01)
(52) U.S. Cl. .................. 257/499; 438/218; 438/622
(58) Field of Classification Search ................. 257/734, 257/499, 500, 774; 438/118, 622, 652, 218, 438/219, 294, 353, 400
See application file for complete search history.

(56) References Cited

U.S. PATENT DOCUMENTS 5,225,700 A * 7/1993 Smayling .................... 257/321
6,376,909 B1 * 4/2002 Forbes et al. ................ 257/734
7,237,218 B2 * 6/2007 Shrowty et al. ................ 716/13
2005/0200383 A1 9/2005 Ogata

FOREIGN PATENT DOCUMENTS

JP   2004-186666   7/2004

* cited by examiner

*Primary Examiner*—Roy K Potter
(74) *Attorney, Agent, or Firm*—McGinn IP Law Group, PLLC

(57) ABSTRACT

A semiconductor device is composed of: a power control region within which function cells are arranged; a basic power supply line overlapping said power control region, and positioned in a power supply interconnection layer; a virtual power supply line arranged in said power control region in a direction perpendicular to said basic power supply line, said function cells being connected to said virtual power supply line; a ground line arranged in said power control region in said direction perpendicular to said basic power supply line; a switch cell including a metal interconnection positioned in a metal interconnection layer different from said power supply interconnection layer, and a switch element electrically connected between said metal interconnection and said virtual power supply line; and a via contact connected between said basic power supply line and said metal interconnection. The switch cell is positioned within power control region. The switch element is positioned adjacent to said via contact within said switch cell. The metal interconnection is positioned between said virtual power supply line and said ground line within said switch cell.

18 Claims, 13 Drawing Sheets

SEMICONDUCTOR INTEGRATED CIRCUIT FOR REDUCING LEAK CURRENT THROUGH MOS TRANSISTORS

BACKGROUND OF THE INVENTION

1. Field of the Invention

The present invention relates to semiconductor integrated circuit architecture for reducing undesirable off-leak currents through MOS transistors.

2. Description of the Related Art

One issue in the advance of the high-density integration of semiconductor devices is the increase in the off-leak current, which designates the current undesirably flowing through off-state MOS transistors. In recent semiconductor devices, the off-leak current accounts for large percentages of total power consumption. Therefore, various techniques have been proposed for reducing the power consumption resulting from the off-leak current.

One approach for reducing the off-leak current is the MT-CMOS (multi-threshold CMOS) technology. Japanese Laid-Open Patent Application No. JP-A 2004-186666 discloses a semiconductor device based on the MT-CMOS technology. FIG. 1 illustrates the structure of the disclosed semiconductor device, which is denoted by the numeral 100. The semiconductor device 100 includes a virtual power supply line Vddv in addition to a power supply line Vdd. The virtual power supply line Vddv is connected to the power supply line Vdd through an NMOS transistor Q1 having a relatively high threshold voltage, which is often called "sleep transistor". The virtual power supply line Vddv is used to feed the power supply voltage to load circuits 101, which are composed of NMOS transistors having a relatively low threshold voltage (denoted by the numerals Q4 and Q5), and PMOS transistors having a relatively low threshold voltage (denoted by the numerals Q2 and Q3). The load circuits 101 are located in specific regions (such, as function blocks), and the power supply to the respective load circuits 101 is implemented in units of the specific regions. In the conventional semiconductor device 100 shown in FIG. 1, the off-leak currents through the load circuits 100 are reduced by the control of a signal PNCT inputted to the gate of the high-threshold NMOS transistor Q1.

FIGS. 2A to 2C illustrate variations of the configuration of the conventional semiconductor circuit based on the MT-CMOS technology. FIG. 2A illustrates an exemplary arrangement of function cells 102 within the load circuits 101. The structure of each load circuit 101 is determined on the combination of the function cells 102. In one MT-CMOS semiconductor circuit, as shown in FIG. 2B, a high-threshold PMOS transistor Q1-1 is used as a sleep transistor to feed the power supply voltage to a load circuit 101-1 composed of three function cells 102, while another high-threshold PMOS transistor Q1-2 is used as another sleep transistor to feed the power supply voltage to a load circuit 101-2 composed of a single function cell 102. In another MT-CMOS semiconductor circuit, as shown in FIG. 2C, a high-threshold PMOS transistor Q1-3 is used to feed the power supply voltage to a load circuit 101-3, while another high-threshold PMOS transistor Q1-4 is used to feed the power supply voltage to a load circuit 101-4. Both of the load circuits 101-3 and 101-4 are composed of two function cells 102.

One issue of the MT-CMOS technology is proper transistor sizing of sleep transistors, such as the high-threshold NMOS transistor Q1 and PMOS transistors Q1-1 to Q1-4. The load circuits 101 may differ in the circuit scale, and therefore currents to be fed to the respective load circuits 101 are dependent on the circuit scales thereof. However, proper transistor sizing of the sleep transistors requires a complicated circuit design process.

U.S. Unexamined Patent Application Publication No. 2005/0200383A1 and the corresponding Japanese Patent Laid Open Patent Application No. 2005-259879 discloses a technique in which power switch cells are distributedly arranged over a circuit cell area. The power supply through the power switch cells is finely controlled for each set of a relatively reduced number of circuit cells. This effectively reduces the voltage drop across the power switches, and improves flexibility of the arrangement of the power switch cells.

SUMMARY OF THE INVENTION

In an aspect of the present invention, a semiconductor device is composed of; a power control region within which function cells are arranged; a basic power supply line overlapping said power control region, and positioned in a power supply interconnection layer; a virtual power supply line arranged in said power control region in a direction perpendicular to said basic power supply line, said function cells being connected to said virtual power supply line; a ground line arranged in said power control region in said direction perpendicular to said basic power supply line; a switch cell including a metal interconnection positioned in a metal interconnection layer different from said power supply interconnection layer, and a switch element electrically connected between said metal interconnection and said virtual power supply line; and a via contact connected between said basic power supply line and said metal interconnection. The switch element receives a power supply voltage from said basic power supply line through said metal interconnection and said via contact to feed said received power supply voltage to said function cells within said power control region. The switch cell is positioned within power control region. The switch element is positioned adjacent to said via contact within said switch cell. The metal interconnection is positioned between said virtual power supply line and said ground line within said switch cell.

The arrangement in which the switch element is adjacent to the via contact between the basic power supply line and the metal interconnection within the switch cell effectively eliminates the influence of the resistance of the metal interconnection, and thereby helps standardization of the switch element. This effectively facilitates sizing of the switch element.

In another aspect of the present invention, a semiconductor device is composed of a power control region within which function cells are arranged; a plurality of basic power supply lines overlapping the power control region; a virtual power supply line provided in the power control region and connected to the function cells; a plurality of switch cells each including a switch element electrically connected between the virtual power supply line and associated one of the plurality of basic power supply lines. The switch cell is positioned within power control region. The virtual power supply line receives a power supply voltage from the plurality of basic power supply lines through the switch elements and feeds the power supply voltage to the function cells.

Such arrangement allows sizing of the switch elements within the respective switch cells only on the basis of the maximum allowed current of the basic power supply lines. This eliminates the need for sizing the switch elements on the basis of the circuit structure within the power control region.

In a preferred embodiment, the switch transistors within the switch cells are turned on at different timings when the power control region is activated. This effectively reduces rushing currents when the power control region starts to be fed with the power supply voltage. The increase in the number of the switch cells is effective for reducing the rushing currents.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Descriptions of various embodiments of the present invention will be given in the following, assuming that semiconductor devices presented in the embodiments are a gate array IC or a cell-based IC. This assumption should be understood as not limiting the present invention. Additionally, it will be assumed that the semiconductor devices are designed to suspend the power supply to a specific region when placed into the standby mode. This assumption should be understood as not limiting the present invention, either.

First Embodiment

Figure 1:
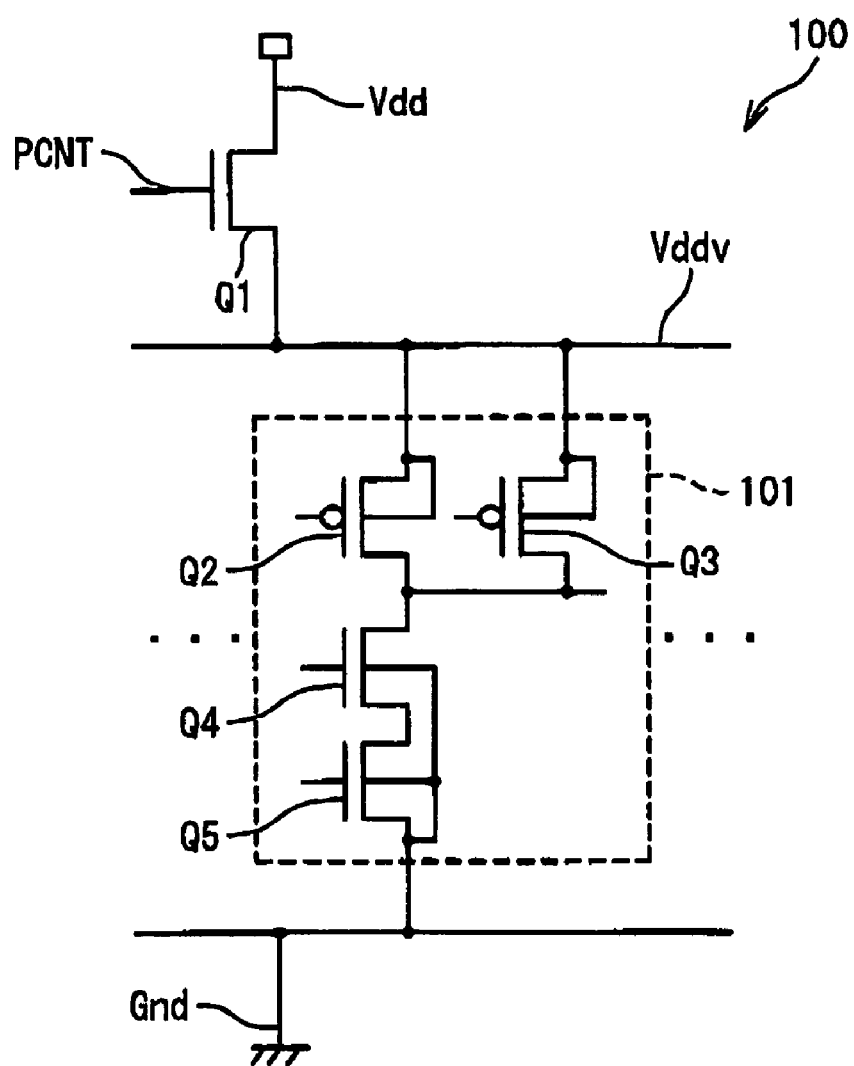
FIG. 1 is a circuit diagram illustrating an exemplary configuration of a conventional semiconductor device based on the MT-CMOS technology.
Figure 2A:
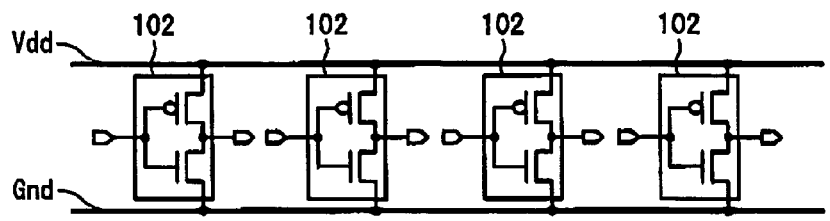
FIGS. 2A to 2C are circuit diagrams illustrating variations of the semiconductor device based on the MT-CMOS technology.
Figure 2B:
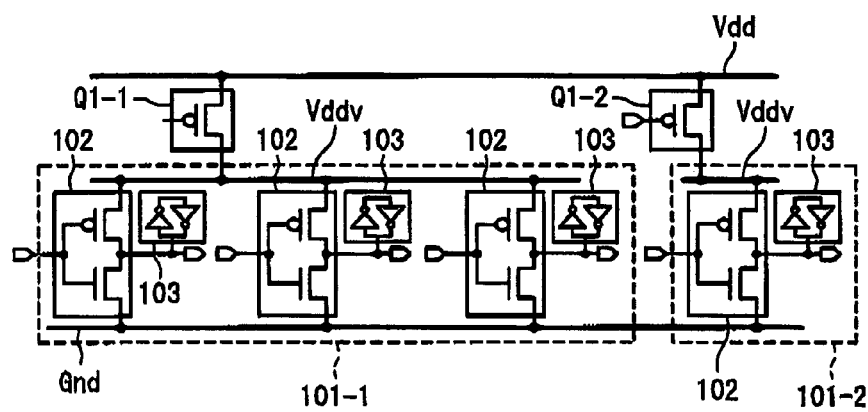
Figure 2C:
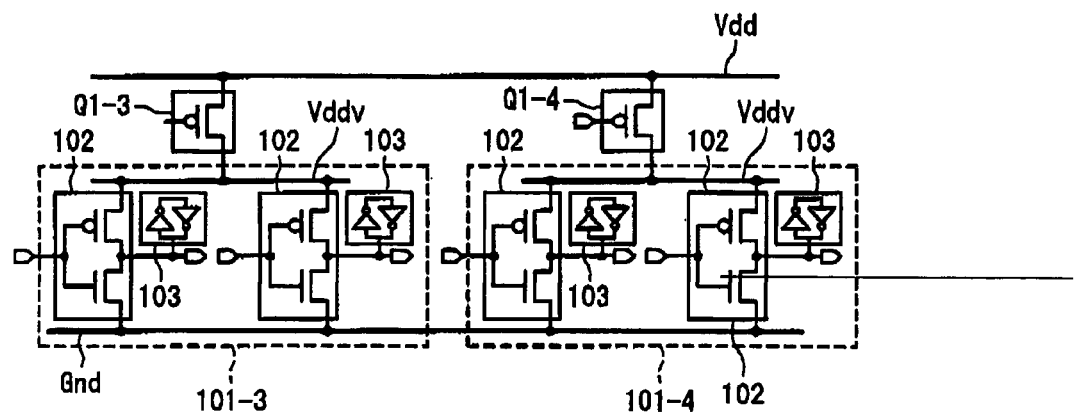
Figure 3:
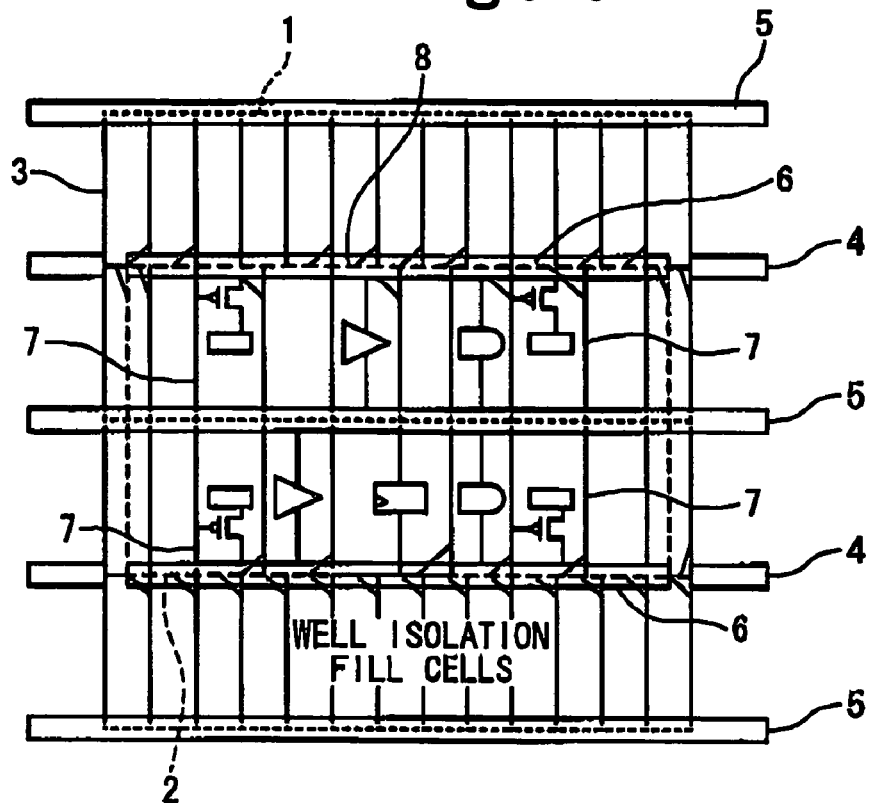
FIG. 3 is a plan view illustrating a layout of a semiconductor device in a first embodiment of the present invention.

FIG. 3 is a plan view illustrating an exemplary configuration of a semiconductor device in a first embodiment. The semiconductor device in this embodiment is provided with a macro region 1 in which function cells 8 are arranged in rows and columns. The function cells 8 each incorporate a logic circuit. The macro region 1 is fed with power supply to operate the function cells 8.

The macro region 1 includes a power control region 2. The semiconductor device in this embodiment is designed so that the power supply to the power control region 2 is suspended to reduce power consumption, when the semiconductor device is placed into the standby mode. In the design procedure, the power control region 2 is defined in the floor planning. The power control region 2 includes a plurality of switch cells 7 each incorporating a switch transistor or sleep transistor. Details of the structure of the switch cells 7 will be described later.

The semiconductor device in this embodiment additionally includes first power supply lines 4, ground lines 5, and second power supply lines 6. The first power supply lines 4 are metal interconnections which provide the power supply voltage VDD to other portions of the macro region 1 than the power control region 2. The ground lines 5 are metal interconnections which provide the ground level voltage GND. The second power supply lines 6 are metal interconnections used as virtual power supply lines which provide the power supply voltage VDD to the power control region 2. In the power control region 2, the ground lines 5 and the second power supply lines 6 are arranged at constant intervals. The second power supply lines 6 are electrically isolated from the first power supply lines 4; the power control region 2 receives the power supply voltage from the second power supply lines 6, not through the first power supply lines 4.

In this embodiment, the first power supply lines 4, the ground lines 5 and the second power supply lines 6 are integrated within the same metal interconnection layer, specifically, within the first metal interconnection layer positioned closest to the semiconductor substrate.

Figure 4:
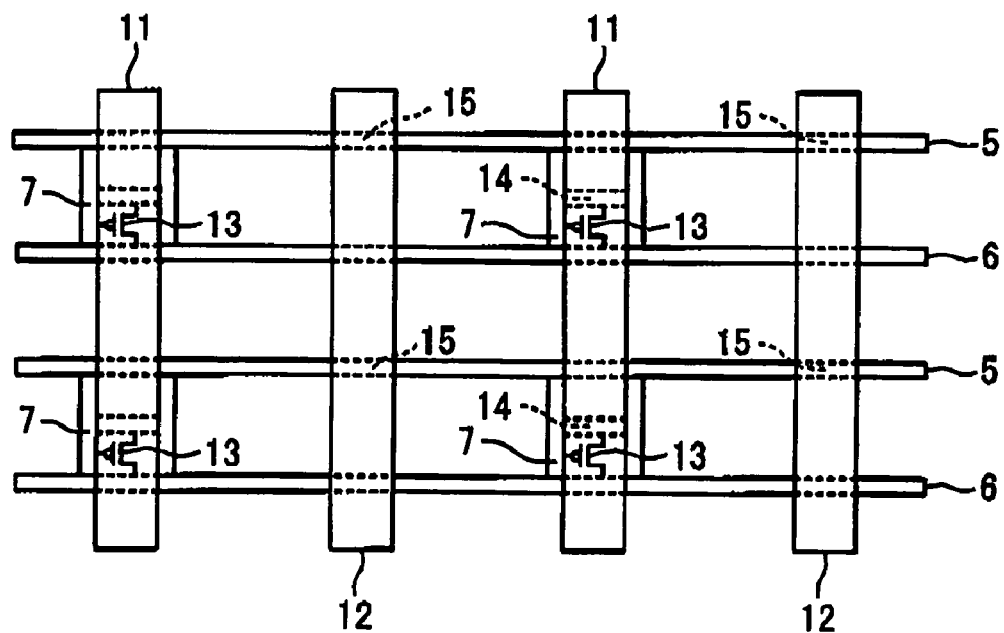
FIG. 4 is a plan view illustrating arrangements of basic power supply lines and basic ground lines in the first embodiment.

A description is made of the power supply to the power control region 2. FIG. 4 is a plan view illustrating the arrangement of interconnections used for the power supply to the power control region 2, and the structure of the switch cells 7. The semiconductor device in this embodiment includes a set of basic power supply lines 11, and a set of basic ground lines 12. The basic power supply lines 11 and the basic ground lines 12 are arranged in parallel to one another in the direction perpendicular to the ground lines 5 and the second power supply lines 6. The basic power supply lines 11 are used to distribute the power supply voltage to the first and second power supply lines 4 and 6, and the basic ground lines 12 are used to distribute the ground level voltage to the ground lines 5. The basic power supply lines 11 and the basic ground lines 12 are integrated within a metal interconnection layer positioned over the first and second power supply lines 4 and 6 and the ground lines 5. The metal interconnection layer in which the basic power supply lines 11 and the basic ground lines 12 are integrated may be referred to as the power supply interconnection layer, hereinafter.

Figure 6:
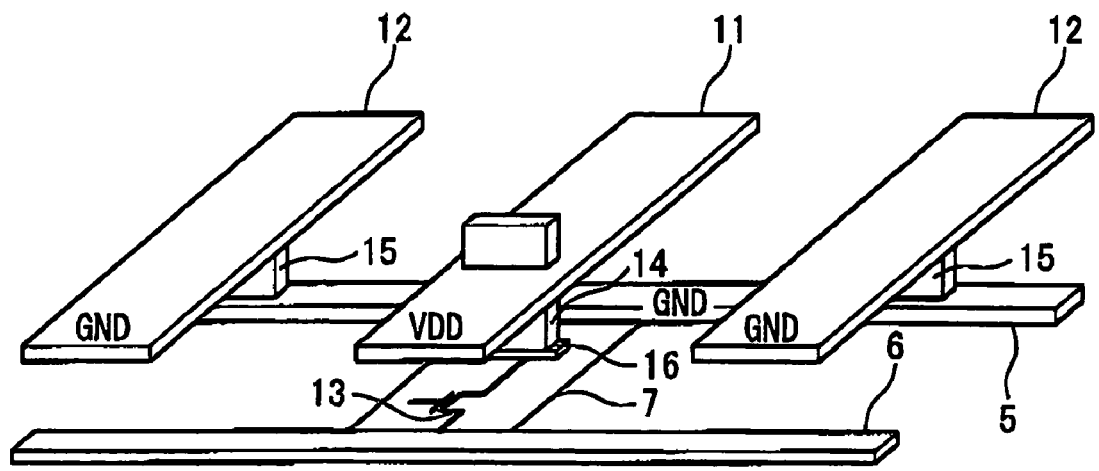
FIG. 6 is a perspective view schematically illustrating the structure of the semiconductor device in the first embodiment.

As shown in FIG. 4, the switch cells 7 are each composed of a switch transistor 13 used as a sleep transistor. As shown in FIG. 6, each switch transistor 13 is connected to a metal interconnection 16 which is connected to associated one of the basic power supply lines 11 through a via contact 14. Via contacts 15 are additionally provided between the ground lines 5 and the basic ground lines 12.

In this structure, the second power supply lines 6 receive the power supply voltage VDD from the basic power supply lines 11 through the switch transistors 13 within the switch cells 7, when the switch transistors 13 are activated.

Figure 5:
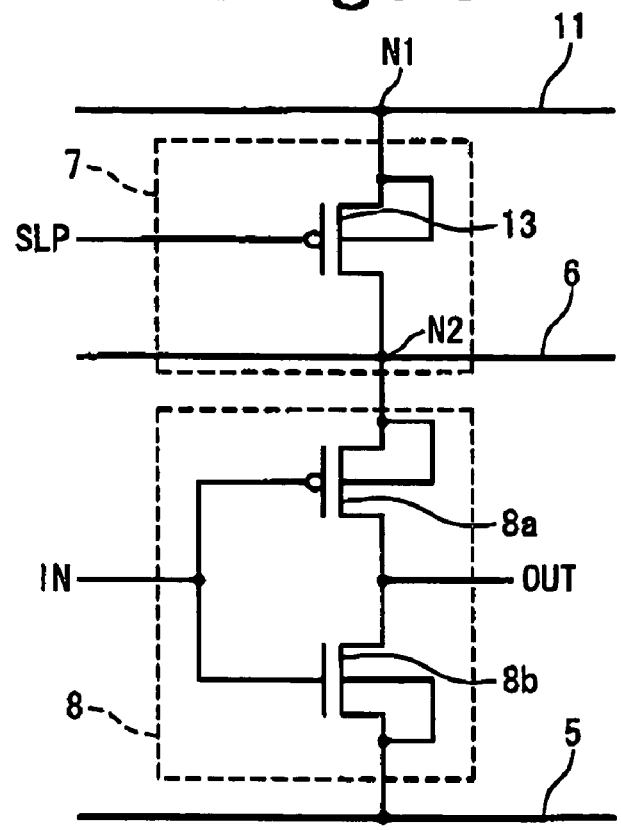
FIG. 5 is an equivalent circuit diagram illustrating the circuit configuration of the semiconductor device in the first embodiment.

FIG. 5 is an equivalent circuit diagram illustrating the circuit configuration of the semiconductor device in this embodiment. Although only one switch cell 7 and one function cell 8 are shown in FIG. 5, it is understood that the semiconductor device in this embodiment includes multiple switch cells 7 and function cells 8 within the power control region 2. In the following description, it is assumed that the function cell 8 incorporates an inverter, and that a PMOS transistor is used as the switch transistor 13 within the switch cell 7. The function cells 8 incorporating an inverter may be referred to as the inverter cells 8, hereinafter.

As shown in FIG. 5, the PMOS switch transistor 13 receives a control signal SLP on the gate thereof. The source of the PMOS switch transistor 13 are electrically connected to the basic power supply line 11 on the node N1, and the drain thereof is connected to the second power supply line 6 on the node N2. The back gate of the PMOS switch transistor 13 is short-circuited to the source thereof; the back gate of the PMOS switch transistor 13 receives the power supply voltage VDD from the basic power supply line 11, that is, the global power supply.

The inverter cells 8 are each composed of a PMOS transistor 8a and an NMOS transistor 8b. The source of the PMOS transistor 8a is connected to the second power supply line 6, and the source of the NMOS transistor 8b is connected to the ground line 5. The drains of the PMOS transistor 8a and the NMOS transistor 8b are commonly connected to the output terminal OUT, and the gates thereof are commonly connected to the input terminal IN. The back gate of the PMOS transistor 8a is short-circuited to the second power supply line 6 and the back gate of the NMOS transistor 8b is short-circuited to the ground line 5.

To activate the power control region 2, the control signal SLP is pulled down to the low level, allowing the switch transistor 13 to feed the power supply voltage VDD from the basic power supply line 11 to the second power supply line 6. To place the power control region 2 into the standby state, on the other hand, the control signal SLP is pulled up to the high level.

FIG. 6 is a perspective view schematically illustrating the structure of the semiconductor device in this embodiment. The switch cells 7 are arranged so that the switch transistors 13 are positioned under the basic power supply lines 11, that is, the basic power supply lines 11 are positioned to overlap the switch transistors 13. Additionally, the switch transistors 13 within the switch cells 7 are arranged adjacent to the via contacts 14, which provide connections between the metal interconnections 16 and the basic power supply lines 11. Such arrangement effectively eliminates the influence of the resistance of the metal interconnections 16 on the currents through the switch transistors 13, and helps the standardization of the sizes of the switch transistors 13. This facilitates sizing of the switch transistors 13.

Figure 7:
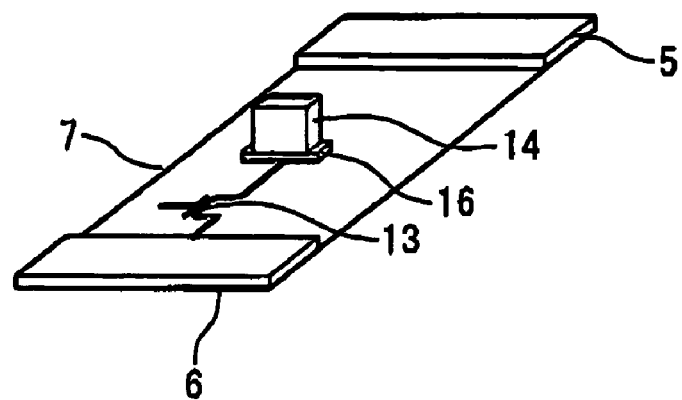
FIGS. 7 and 8 illustrate exemplary definitions of a switch cell in the first embodiment.
Figure 8:
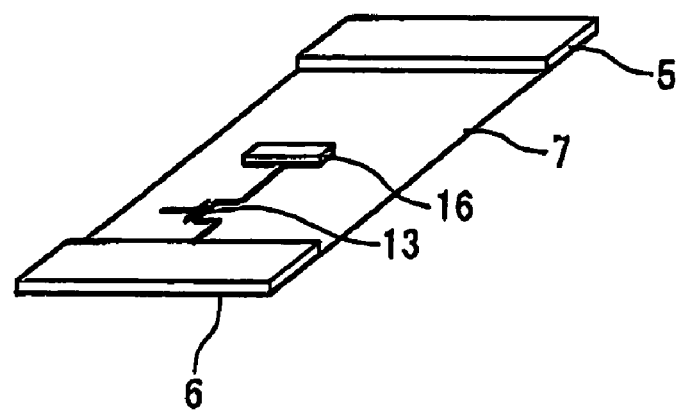

FIGS. 7 and 8 are perspective view schematically illustrating exemplary definitions of the switch cells 7. In one embodiment, as shown in FIG. 7, the switch cells 7 are defined as each including a switch transistor 13, a via contact 14, a metal interconnection 16, and a pair of metal interconnections, one of which being used as a portion of a ground line 5, and the other being used as a portion of a second power supply line 6. The metal interconnection 16 are positioned between the first and second power supple lines 4 and 5 within each switch cell 7. It should be noted that the ground line 5, the second power supply line 6, and the metal interconnection 16 are all positioned in the first metal interconnection layer. The via contact 14 is connected to the metal interconnection 16, and the switch transistor 13 is connected between the metal interconnection 16 and the second power supply line 6. When the definition of the switch cells 7 shown in FIG. 7 is used in the cell placement of the circuit design, the basic power supply lines 11 are routed in the interconnection routing so that each via contact 14 is connected with one of the basic power supply lines 11.

It should be noted that the metal interconnection 16 are positioned between the ground line 5 and the second power supple line 6 within each switch cell 7. Such structure improves the flexibility of the cell placement of the switch cells 7 and function cells 8. If the metal interconnection 16 is positioned at the top edge of the switch cell 7 in place of the second power supple line 6, it prevents a function cell 8 from being placed adjacent to the top edge. The same applies to the case when the metal interconnection 16 is positioned at the bottom edge of the switch cell 7. The structure in which the metal interconnection 16 are positioned between the ground line 5 and the second power supple line 6 advantageously allows a function cell 8 to be placed adjacent to the top or bottom edge of a switch cell 7.

In another embodiment, as shown in FIG. 8, the switch cells 7 may be defined as each including a switch transistor 13, a metal interconnection 16, and portions of a ground line 5 and a second power supply line 6. In this case, the via contacts 14 are excluded from the switch cells 7, and the power supply line routing in the circuit design procedure is implemented so that the via contacts 14 are placed between the basic power supply lines 11 and the metal interconnections 16. It should be noted that the metal interconnection 16 in FIGS. 7 and 8 corresponds to the node N1.

Figure 9:
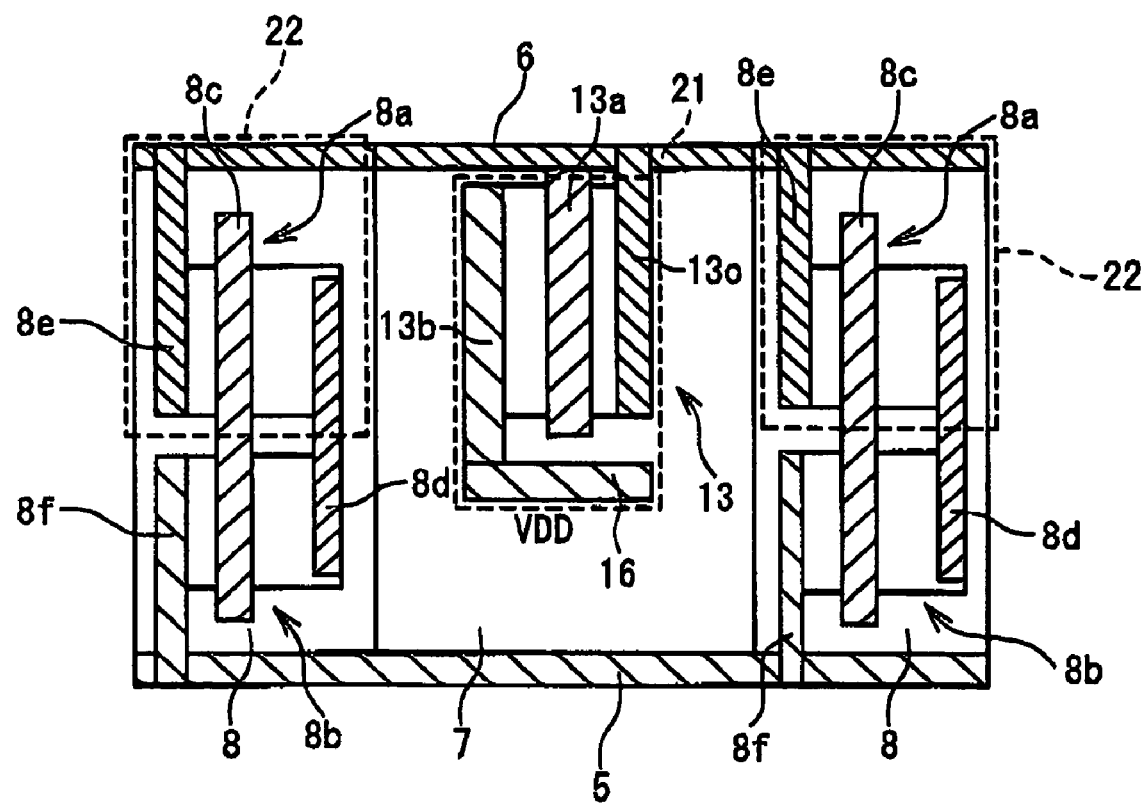
FIG. 9 is a layout diagram illustrating an exemplary layout of the switch cell in the first embodiment.

FIG. 9 is a layout diagram illustrating an exemplary layout of the switch cell 7 and the inverter cell 8. The PMOS switch transistor 13 within the switch cell 7 is formed in a first N-well 21. The PMOS transistor 13 includes a gate electrode 13a, a source electrode 13b connected to the metal interconnection 16, which receives the power supply voltage VDD through the via contact 14, and a drain electrode 13c connected to the second power supply line 6. The metal interconnection 16 is positioned above the first N-well 21.

The PMOS transistor 8a and the NMOS transistor 8b within each inverter cell 8 share a common gate electrode 8c and a common drain electrode 8d. The source electrodes 8e of the PMOS transistors 8a are connected to the second power supply line 6, and the source electrodes 8f of the NMOS transistors 8b are connected to the ground line 5. The PMOS transistors 8a within the inverter cells 8 are formed in second N-wells 22 that are electrically separated from the first N-well 21.

It should be noted that the PMOS switch transistors 13 within the switch cells 7 and the PMOS transistors 8a within the inverter cells 8 are formed in electrically separated N-wells. This allows independently controlling the back gate voltages of the PMOS switch transistors 13 and the PMOS transistors 8a.

In a preferred embodiment, the PMOS switch transistors 13 are designed to exhibit an off-leak current smaller than that of the PMOS transistors 8a within the function cells 8. Specifically, in one embodiment, the PMOS switch transistors 13 is designed so that the threshold voltage of the PMOS switch transistors 13 is higher than that of the PMOS transistors 8a. Such design effectively reduces the total off-leak current of the semiconductor device in this embodiment.

In one embodiment, each of the switch cells 7 and the function cells 8 is designed to include portions of a ground line 5 and a second power supply line 6. This allows automatically routing the ground lines 5 and second power supply lines 6 in the cell placement in the circuit design procedure.

One feature of this embodiment is that each second power supply line 6 distributedly receives the power supply voltage VDD from multiple basic power supply lines 11 through multiple switch cells 7 connected between the each second power supply line 6 and the basic power supply lines 11. Each of the switch cells 7 connected to a relevant second power supply line 6 receives the power supply voltage VDD from associated one of the basic power supply lines 11 and feeds the received power supply voltage VDD to the relevant second power supply line 6. The positions of the switch cells 7 within the power control region 2 are determined in accordance with the circuit structure within the power control region 2 and the arrangement of the basic power supply lines 11.

Such structure eliminates the need for the transistor sizing of the switch transistors 13 within the switch cells 7 on the basis of the circuit structure within the power control region 2. The gate sizes of the switch transistors 13, including the gate lengths (L) and the gate widths (W), can be determined independently from the circuit structure within the power control region 2, and fixed only on the basis of the maximum allowed currents through the respective basic power supply lines 11, since the maximum allowed currents of the respective basic power supply lines 11 are predetermined from the widths of the basic power supply lines 11. Specifically, the gate size of each switch transistor 13 is determined designed so that each switch transistor 13 has a sufficient drive capacity for feeding the maximum allowed current of the basic power supply line 11 connected thereto.

It should be noted that the switch cells 7 are arranged under the associated basic power supply lines 11 with the switch transistors 13 arranged adjacent to the via contacts 14. Such structure allows fixing the current routes from the basic power supply lines 11 to the second power supply lines 6, and thereby helps the standardization of the sizes of the switch transistors 13.

In one embodiment, the sizes of the switch transistors 13 may be increased with the widths of the basic power supply lines 11 increased. Such sizing effectively reduces the number of the switch cells 7, and thereby reduces the layout size of the semiconductor circuit.

In another embodiment, the number of the switch cells 7 is increased, and the sizes of the switch transistors 13 are decreased with the widths of the basic power supply lines 11 decreased. In this case, the multiple switch cells 7 connected to one second power supply line 6 may be turned on at different timings to activate the power control region 2. This effectively reduces rushing currents when the power control region 2 starts to be fed with the power supply voltage VDD. The increase in the number of the switch cells 7 is effective for reducing the rushing currents.

Figure 10:
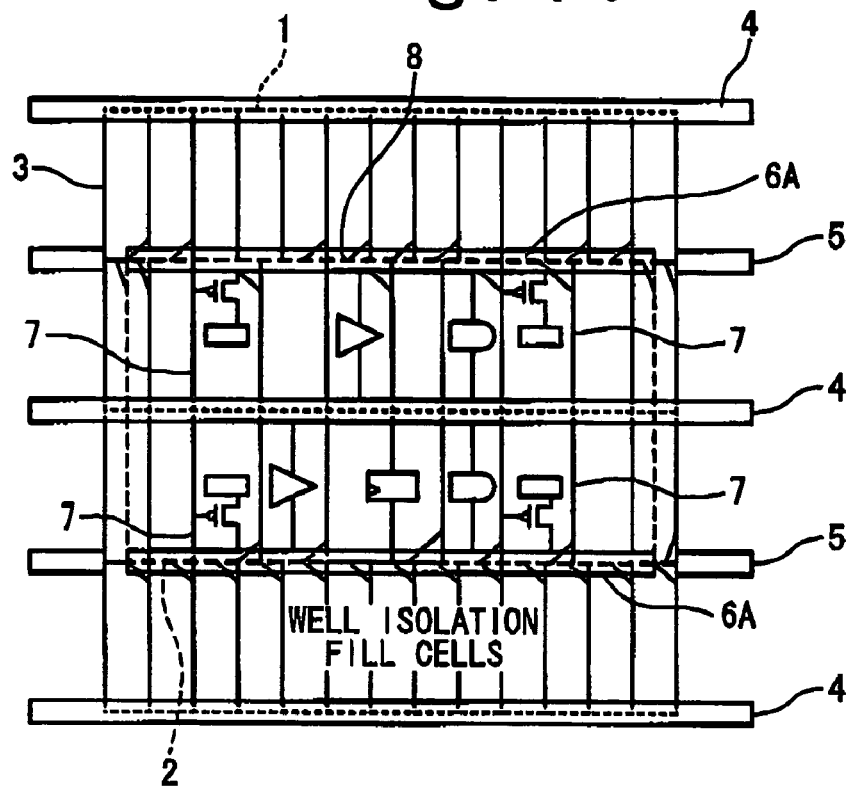
FIG. 10 is a plan view illustrating a layout of a semiconductor device in an alternative embodiment of the present invention.

In an alternative embodiment, as shown in FIGS. 10 to 13, the switch cells 7 are used to switch electrical connections between the basic ground lines 12 and the function cells 8 within the power control region 2. In this case, as shown in FIG. 10, the first power supply lines 4 are provided within the power control region 2 in place of the ground lines 5, and virtual ground lines 6A are provided within the power control region 2 in place of the second power supply lines 6. The virtual ground lines 6A are used to distribute the ground level voltage received from the basic ground lines 12 to the function cells 8.

Figure 11:
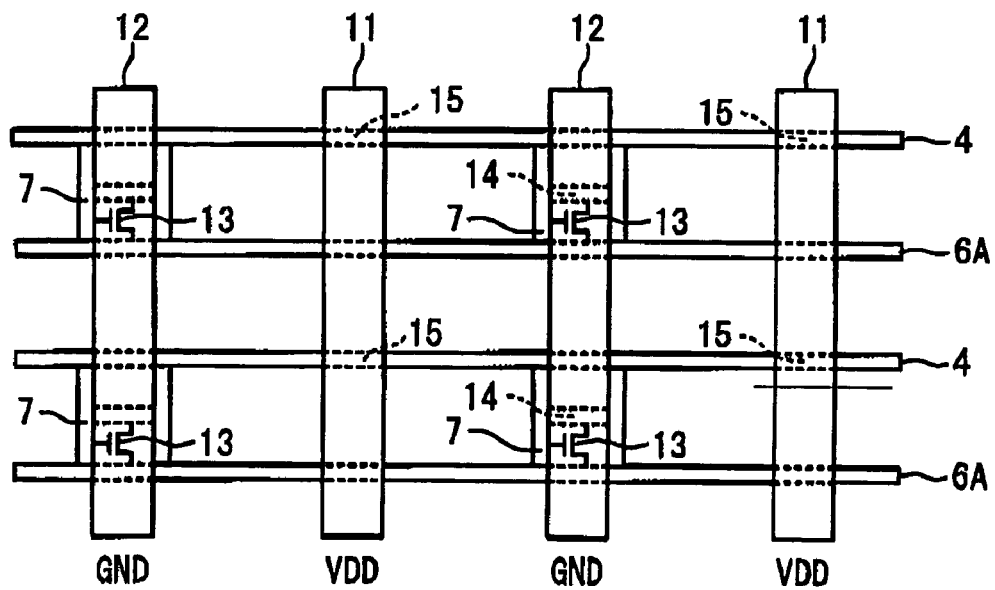
FIG. 11 is a plan view illustrating arrangements of basic power supply lines and basic ground lines in the alternative embodiment.
Figure 13:
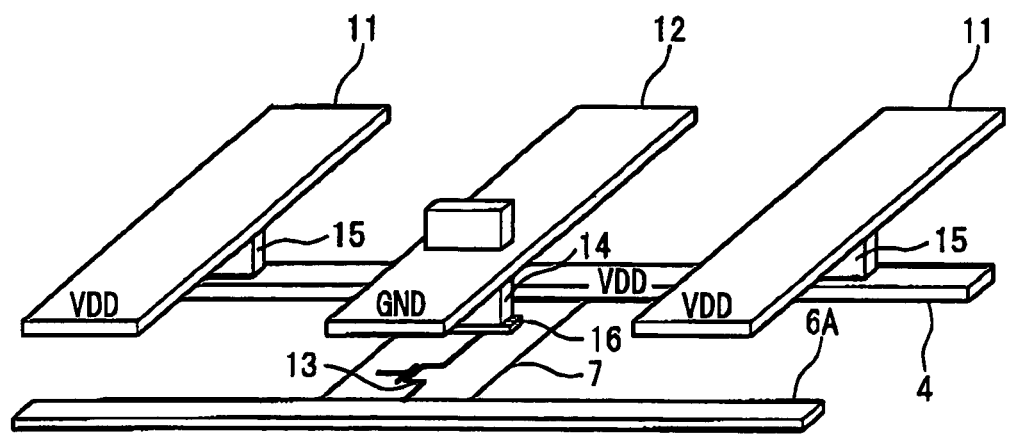
FIG. 13 is a perspective view schematically illustrating the structure of the semiconductor device in the alternative embodiment.

As shown in FIG. 11, the switch cells 7 respectively include switch transistors 13 to switch electrical connections between the basic ground lines 12 and the function cells 8. As shown in FIG. 13, each switch transistor 13 is electrically connected between the associated virtual ground line 6A and a metal interconnection 16 connected to the basic ground line 12. The metal interconnection 16 is positioned between the power supply line 4 and the virtual ground line 6A.

Figure 12:
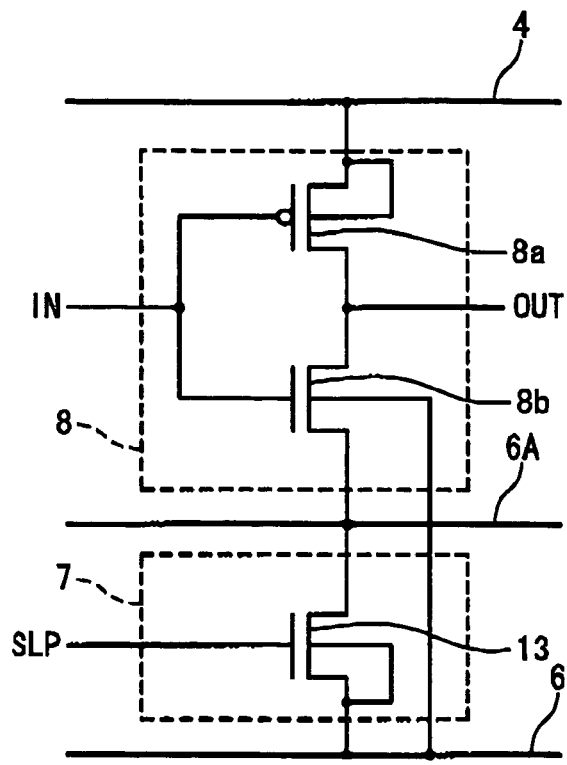
FIG. 12 is an equivalent circuit diagram illustrating the circuit configuration of the semiconductor device in the alternative embodiment.

FIG. 12 is an equivalent circuit diagram of the semiconductor device in this embodiment. It should be noted that the function cell 8 is assumed to be an inverter cell composed of a PMOS transistor 8a and an NMOS transistor 8b. In this embodiment, as shown in FIG. 12, the switch transistor 13 is composed of an NMOS transistor having a drain connected to the virtual ground line 6A, and a source connected to the basic ground line 12. The switch transistor 13 receives the control signal SLP on the gate, and the back gate of the switch transistor 13 is short-circuited to the source thereof. The switch transistor 13 feeds the ground level voltage received from the basic ground line 12 to the virtual ground line 6A in response to the control signal SLP.

Second Embodiment

A description is made of a second embodiment of the present invention, with reference to FIGS. 10 to 16. It should be noted that the same numerals denote the same elements in the attached figures.

Figure 14:
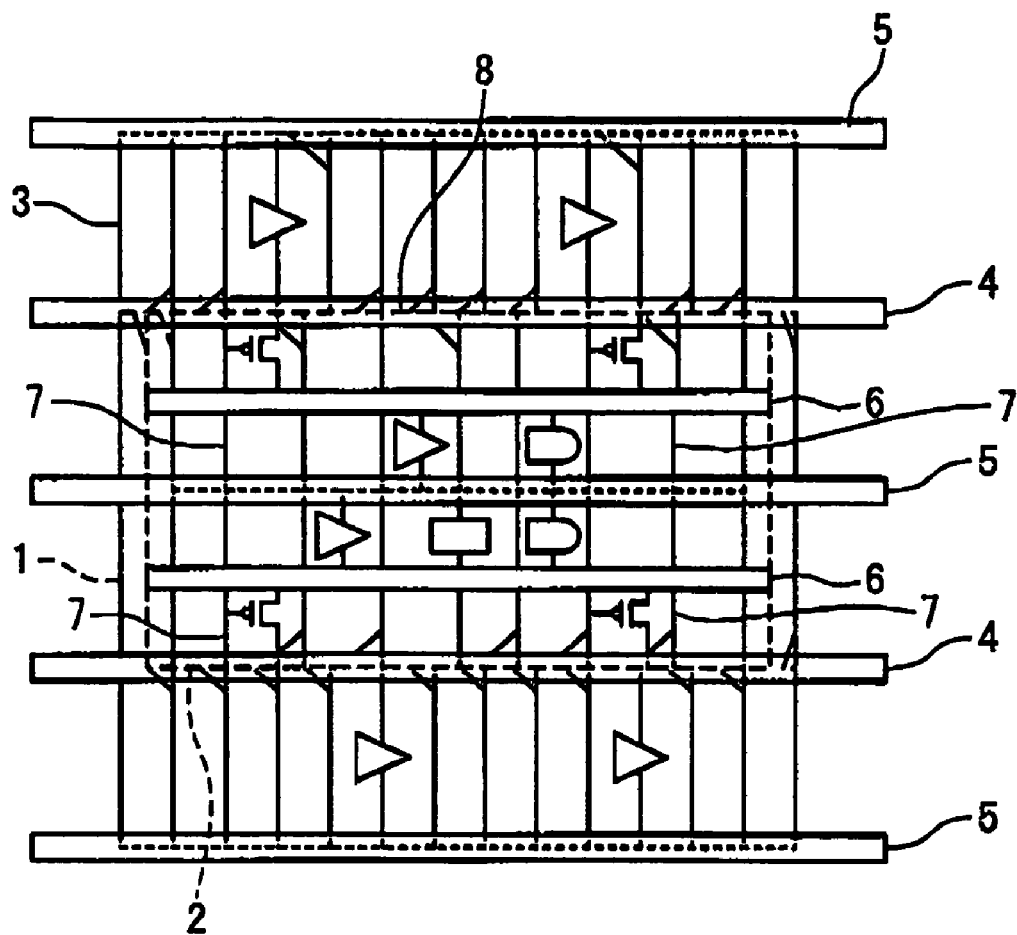
FIG. 14 is a plan view illustrating a layout of a semiconductor device in a second embodiment of the present invention.

FIG. 14 is a plan view illustrating an exemplary structure of a semiconductor device in a second embodiment of the present invention. The structure of the semiconductor device in the second embodiment is almost similar to that in the second embodiment. The switch cells 7 and the function cells 8 are provided in the power control region 2, within the macro region 1.

one difference is that the first power supply lines 4 are distributed over the whole of the macro region 1, including the power control region 2 in the second embodiment; the first power supply lines 4 are positioned to overlap the power control region 2. The first power supply lines 4 and the ground lines 5 are arranged in parallel at constant intervals, and the second power supply lines 6 are arranged between the first power supply lines 4 and the ground lines 5. The first power supply lines 4, the ground lines 5, and the second power supply lines 6 are positioned at the first metal interconnection layer.

As shown in FIG. 14, the switch cells 7 are electrically connected between the first power supply lines 4 and the second power supply lines 6, and the power supply terminals of the function cells 8 are connected to the second power supply lines 6. The function cells 8 receives the power supply voltage VDD from the first power supply lines 4 through the switch cells 7 and the second power supply lines 6.

Figure 15:
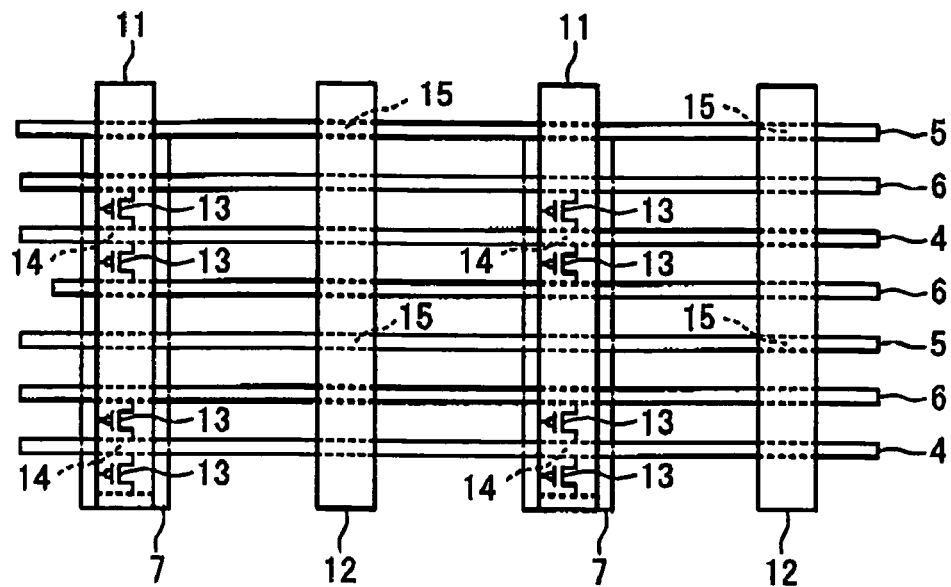
FIG. 15 is a plan view illustrating arrangements of basic power supply lines and basic ground lines in the second embodiment.

FIG. 15 is a plan view illustrating exemplary structure and arrangement of the switch cells 7 and interconnections connected thereto in the second embodiment. As is the case of the first embodiment, the basic power supply lines 11 and the basic ground lines 12 are arranged in parallel at constant intervals in the direction perpendicular to the first power supply lines 4, the ground lines 5, and the second power supply lines 6. The basic power supply lines 11 and the basic ground lines 12 are integrated within the power supply interconnection layer, which is a metal interconnection layer positioned over the first power supply lines 4, the ground lines 5, and the second power supply lines 6.

The switch cells 7 each include a switch transistor 13. Differently from the first embodiment, the switch transistors 13 are connected between the first power supply lines 4 and the second power supply lines 6 in the second embodiment, and the first power supply lines 4 are connected to the basic power supply lines 11 through via contacts 14. Therefore, the second power supply lines 6 receives the power supply voltage VDD from the basic power supply lines 11 through the first power supply lines 4 and the switch transistors 13. Additionally, via contacts 15 are provided to provide electrical connections between the ground lines 4 and the basic ground lines 12.

Figure 16:
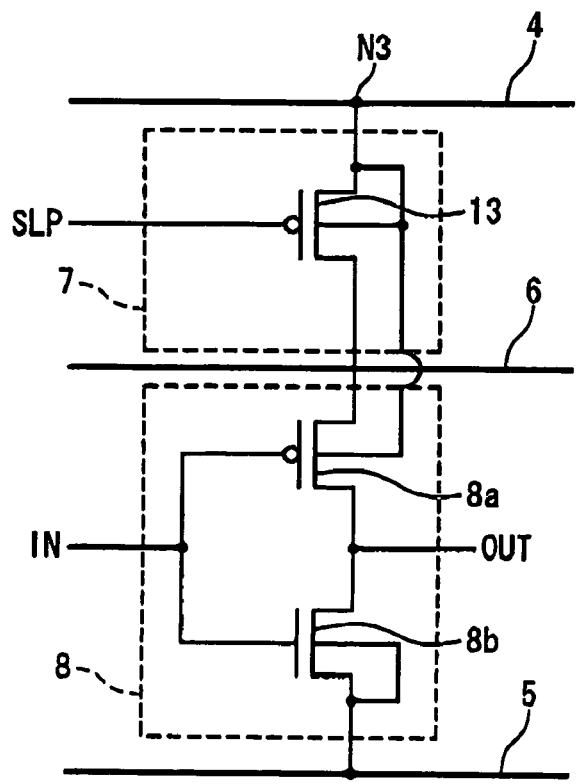
FIG. 16 is an equivalent circuit diagram illustrating the circuit configuration of the semiconductor device in the second embodiment.

FIG. 16 is an equivalent circuit diagram illustrating the circuit configuration of the semiconductor device in the second embodiment. In the following description, it is assumed that the function cell 8 incorporates an inverter, and that a PMOS transistor is used as the switch transistor 13 within the switch cell 7.

As shown in FIG. 16, the PMOS switch transistor 13 receives a control signal SLP on the gate thereof. The source of the PMOS switch transistor 13 are electrically connected to the first power supply line 11 on the node N3, and the drain thereof is connected to the second power supply line 6. The back gate of the PMOS switch transistor 13 is short-circuited to the source thereof; the back gate of the PMOS switch transistor 13 receives the power supply voltage VDD from the basic power supply line 11, that is, the global power supply.

Figure 17:
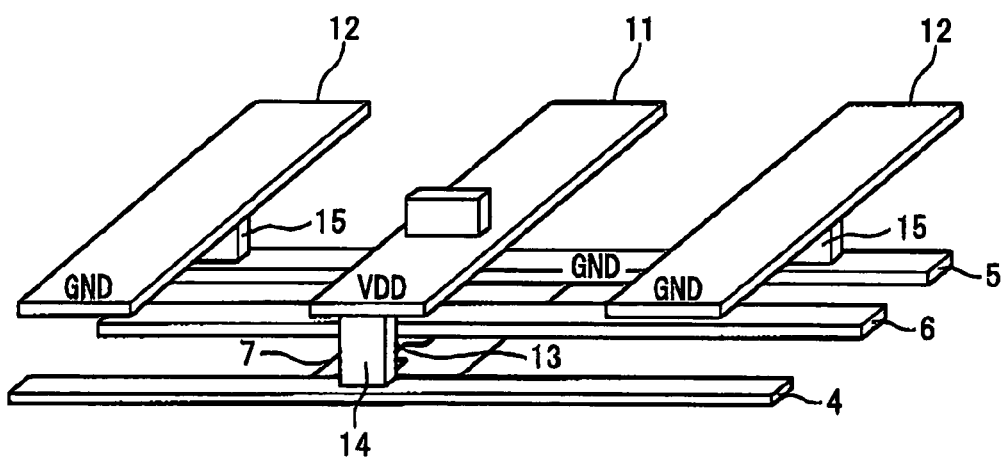
FIG. 17 is a perspective view schematically illustrating the structure or the semiconductor device in the second embodiment.

The inverter cells 8 are each composed of a PMOS transistor 8a and an NMOS transistor 8b. The back gate of the PMOS transistor 8a is electrically connected to the back gate of the PMOS switch transistor 13. In other words, the PMOS transistor 8a and the PMOS switch transistor 13 are formed in the same N-well. The back gates of the PMOS transistor 8a and PMOS switch transistor 13 are fed with the power supply voltage VDD from the first power supply line 4. FIG. 17 is a perspective view schematically illustrating the structure of the semiconductor device in this embodiment. The switch cells 7 are arranged so that the switch transistors 13 are positioned under the associated basic power supply lines 11. Additionally, the switch transistors 13 are arranged adjacent to the via contacts 14, which provide connections between the basic power supply lines 11 and the first power supply lines 4. Such arrangement effectively eliminates the influence of the resistance of the first power supply lines 4 on the currents through the switch transistors 13, and helps the standardization of the sizes of the switch transistors 13. This facilitates sizing of the switch transistors 13.

Figure 18:
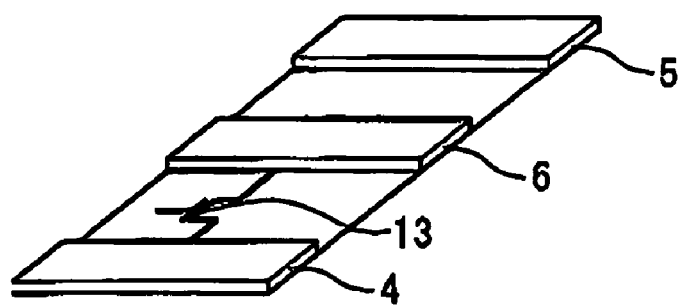
FIGS. 18 and 19 illustrate exemplary definitions of a switch cell in the second embodiment.
Figure 19:
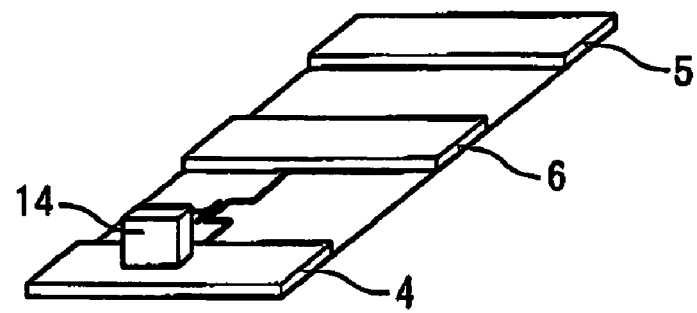

FIGS. 18 and 19 are perspective view schematically illustrating exemplary definitions of the switch cells 7 in this embodiment. In one embodiment, as shown in FIG. 18, the switch cells 7 are defined as each including a switch transistor 13, a set of three metal interconnections, one of which being used as a part of a first power supply line 4, another being used as a part of a ground line 5, and the other being used as a part of a second power supply line 6. In this case, the via contacts 14 are excluded from the switch cells 7, and the power supply line routing in the circuit design procedure is implemented so that the via contacts 14 are placed between the basic power supply lines 11 and the first power supply lines 4.

In another embodiment, as shown in FIG. 19, the switch cells 7 may be defined as each additionally including a via contact 14. In this case, the basic power supply lines 11 are routed in the interconnection routing so that each via contact 14 is connected with one of the basic power supply lines 11.

Figure 20:
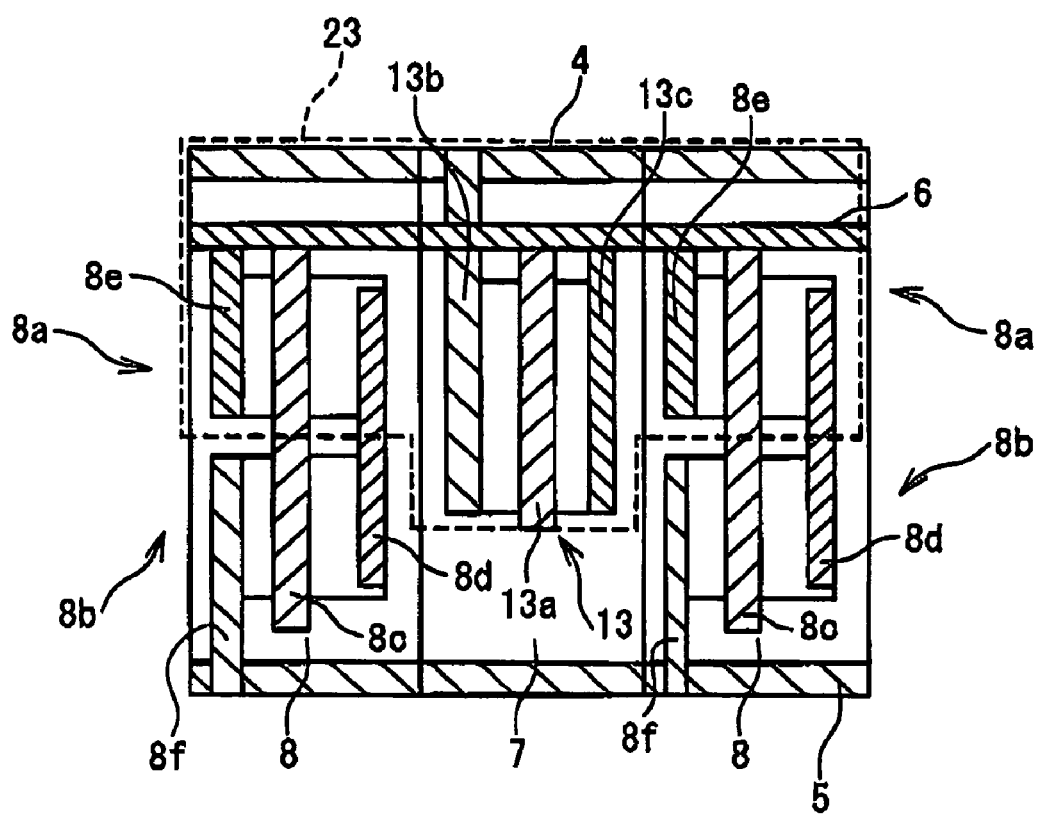
FIG. 20 is a layout diagram illustrating an exemplary layout of the switch cell in the second embodiment.

FIG. 20 is a layout diagram illustrating an exemplary layout of the switch cells 7, and the inverter cells 8 in this embodiment. The PMOS switch transistor 13 includes a gate electrode 13a, a source electrode 13b connected to the first power supply line 4, which receives the power supply voltage VDD through the via contact 14, and a drain electrode 13c connected to the second power supply line 6.

The PMOS transistor 8a and the NMOS transistor 8b within each inverter cells 8 share a common gate electrode 8c and a common drain electrode 8d. The source electrodes 8e of the PMOS transistors 8a are connected to the second power supply line 6, and the source electrodes 8f of the NMOS transistors 8b are connected to the ground line 5.

In this embodiment, the PMOS transistors 8a within the inverter cells 8 and the PMOS switch transistor 13 within the switch cell 7 are formed in the same N-well 23. This eliminates the need for separation of the N-wells between the PMOS transistors 8a and the PMOS switch transistor 13, and thereby effectively reduces the size of the semiconductor device in this embodiment.

All of the switch cells 7 and the function cells 8 are designed to include portions of a first power supply line 4, a ground line 5 and a second power supply line 6. This allows automatically routing the first power supply lines 4, the ground lines 5 and second power supply lines 6 in the cell placement in the circuit design procedure. The semiconductor device in the second embodiment enjoys the same advantageous features as that in the first embodiment. Additionally, the semiconductor device in the second embodiment additionally has an advantage of the reduced circuit size, since the PMOS transistors 8a within the inverter cells 8 and the PMOS switch transistors 13 within the switch cells 7 are formed in the same N-well.

It is apparent that the present invention is not limited to the above-described embodiments, which may be modified and changed without departing from the scope of the invention.

What is claimed is:

1. A semiconductor device comprising:
   a power control region within which function cells are arranged;
   a basic power supply line overlapping said power control region, and positioned in a power supply interconnection layer;
   a virtual power supply line arranged in said power control region in a direction perpendicular to said basic power supply line, said function cells being connected to said virtual power supply line;
   a ground line arranged in said power control region in said direction perpendicular to said basic power supply line;
   a switch cell including:
     a metal interconnection positioned in a metal interconnection layer different from said power supply interconnection layer, and
     a switch element electrically connected between said metal interconnection and said virtual power supply line; and
   a via contact connected between said basic power supply line and said metal interconnection, wherein said switch element receives a power supply voltage from said basic power supply line through said metal interconnection and said via contact to feed said received power supply voltage to said function cells within said power control region, wherein said switch cell is positioned within power control region, wherein said switch element is positioned adjacent to said via contact within said switch cell, and wherein said metal interconnection is positioned between said virtual power supply line and said ground line within said switch cell.

2. The semiconductor device according to claim 1, wherein said switch element is positioned under said basic power supply line.

3. The semiconductor device according to claim 1, further comprising:
at least one other basic power supply line positioned in said power supply interconnection layer;
at least one other switch cell each including an other metal interconnection and an other switch element connected between said other metal interconnection and said virtual power supply line, said other metal interconnection being positioned in said metal interconnection layer; and
at least one other via contact connected between said at least one basic power supply line and said other metal interconnection.

4. The semiconductor device according to claim 3, wherein said switch element and said other switch element are turned on at different timings when said power control region is activated.

5. The semiconductor device according to claim 1, wherein said switch element includes a MOS switch transistor having a sufficient drive capacity for feeding the maximum allowed current of said basic power supply line to said function cells.

6. The semiconductor device according to claim 1, wherein said function cells each including a MOS transistor; and
wherein said switch element includes a switch transistor exhibiting a off-leak current smaller than that of said MOS transistor.

7. The semiconductor device according to claim 1, wherein said switch element includes a MOS switch transistor formed within a first well, and
wherein said function cells each including a MOS transistor formed within a second well electrically separated from said second well.

8. The semiconductor device according to claim 1,
wherein said switch element includes a MOS switch transistor,
wherein said function cells each including a MOS transistor, and
wherein said MOS switch transistor and said MOS transistor are formed within the same well.

9. A semiconductor device comprising:
a power control region within which function cells are arranged;
a basic ground line overlapping said power control region, and positioned in a power supply interconnection layer;
a virtual ground line arranged in said power control region in a direction perpendicular to said basic power supply line, said function cells being connected to said virtual power supply line;
a power supply line arranged in said power control region in said direction perpendicular to said basic ground line;
a switch cell including;
  a metal interconnection positioned in a metal interconnection layer different from said power supply interconnection layer; and
  a switch element electrically connected between said metal interconnection and said virtual ground line,
a via contact connected between said basic ground line and said metal interconnection,
wherein said switch element receives a ground level voltage from said basic ground line through said metal interconnection and said via contact to feed said received ground level voltage to said function cells within said power control region,
wherein said switch cell is positioned within power control region, and
wherein said switch element is positioned adjacent to said via contact within said switch cell, and
wherein said metal interconnection is positioned between said power supply line and said virtual ground line within said switch cell.

10. The semiconductor device according to claim 9, wherein said switch element is positioned under said basic power supply line.

11. The semiconductor device according to claim 9, further comprising;
at least one other basic ground line positioned in said power supply interconnection layer;
at least one other switch cell each including an other metal interconnection and an other switch element connected between said other metal interconnection and said virtual ground line, said other metal interconnection being positioned in said metal interconnection layer; and
at least one other via contact connected between said at least one basic ground line and said other metal interconnection.

12. The semiconductor device according to claim 11, wherein said switch element and said other switch element are turned on at different timings when said power control region is activated.

13. A layout method of a semiconductor device comprising;
defining a power control region;
performing placement of function cells and a switch cell within said power control region, said function cells and said switch cell each including portions of a virtual power supply line and a ground line, and said switch cell additionally including a metal interconnection and a switch element electrically connected between said portion of said virtual power supply line and said metal interconnection;
arranging a via contact; and
arranging a basic power supply line extending in a direction perpendicular to said virtual power supply line and said ground line to overlap said power control region, and positioned in a power supply interconnection layer located over said metal interconnection, so that said via contact is connected between said basic power supply line and said metal interconnection, allowing said switch element to receive a power supply voltage from said basic power supply line through said metal interconnection and said via contact to feed said received power supply voltage to said function cells within said power control region through said portion of said virtual power supply line,
wherein said switch element is positioned adjacent to said via contact within said switch cell, and wherein said metal interconnection is positioned between said portions of said virtual power supply line and said ground line.

14. The layout method according to claim 13, wherein said switch cell is arranged so that said switch element is positioned under said basic power supply line.

15. The layout method according to claim 13, wherein said switch element includes a MOS switch transistor having a sufficient drive capacity for feeding the maximum allowed current of said basic power supply line to said function cells.

16. The layout method according to claim 13, wherein said function cells each including a MOS transistor; and
wherein said switch element includes a switch transistor exhibiting a off-leak current smaller than that of said MOS transistor.

17. The layout method according to claim 13, wherein said switch element includes a MOS switch transistor formed within a first well, and
wherein said function cells each including a MOS transistor formed within a second well electrically separated from said second well.

18. The layout method according to claim 13,
wherein said switch element includes a MOS switch transistor,
wherein said function cells each including a MOS transistor, and
wherein said MOS switch transistor and said MOS transistor are formed within the same well.

* * * * *